(12) United States Patent
Diamant

(10) Patent No.: US 10,140,096 B1
(45) Date of Patent: Nov. 27, 2018

(54) PREVENTING RING OSCILLATOR PHASE-LOCK

(71) Applicant: AMAZON TECHNOLOGIES, INC., Seattle, WA (US)

(72) Inventor: Ron Diamant, Albany, CA (US)

(73) Assignee: Amazon Technologies, Inc., Seattle, WA (US)

( * ) Notice: Subject to any disclaimer, the term of this patent is extended or adjusted under 35 U.S.C. 154(b) by 40 days.

(21) Appl. No.: 15/379,103

(22) Filed: Dec. 14, 2016

(51) Int. Cl.
*G06F 7/58* (2006.01)
*H03K 3/03* (2006.01)
*G11C 8/04* (2006.01)

(52) U.S. Cl.
CPC ............ *G06F 7/584* (2013.01); *G11C 8/04* (2013.01); *H03K 3/0315* (2013.01); *G06F 2207/581* (2013.01)

(58) Field of Classification Search
None
See application file for complete search history.

(56) References Cited

U.S. PATENT DOCUMENTS

| | | | | |
|---|---|---|---|---|
| 9,858,042 B1* | 1/2018 | Diamant | ............ | G06F 7/588 |
| 2006/0069706 A1* | 3/2006 | Lazich | ............ | G06F 7/588 |
| | | | | 708/251 |
| 2014/0280413 A1* | 9/2014 | Lewis | ............ | G06F 7/588 |
| | | | | 708/251 |
| 2014/0351305 A1* | 11/2014 | Hamilton | ............ | G06F 7/588 |
| | | | | 708/251 |
| 2015/0193205 A1* | 7/2015 | Boehl | ............ | G06F 7/588 |
| | | | | 708/203 |

* cited by examiner

*Primary Examiner* — David H Malzahn
(74) *Attorney, Agent, or Firm* — Blank Rome LLP

(57) ABSTRACT

A device includes parallel connected ring oscillators, a pseudo random number generator (PRNG), and a configuration circuit. The parallel connected ring oscillators include a first and second ring oscillator. The PRNG is configured to generate pseudo random bits at every cycle. The configuration circuit is configured to receive and parse the pseudo random bits to generate and distribute a first configuration value and second configuration value based on the pseudo random bits. The first ring oscillator is configured according to the first configuration value. The second ring oscillator is configured according to the second configuration value.

20 Claims, 5 Drawing Sheets

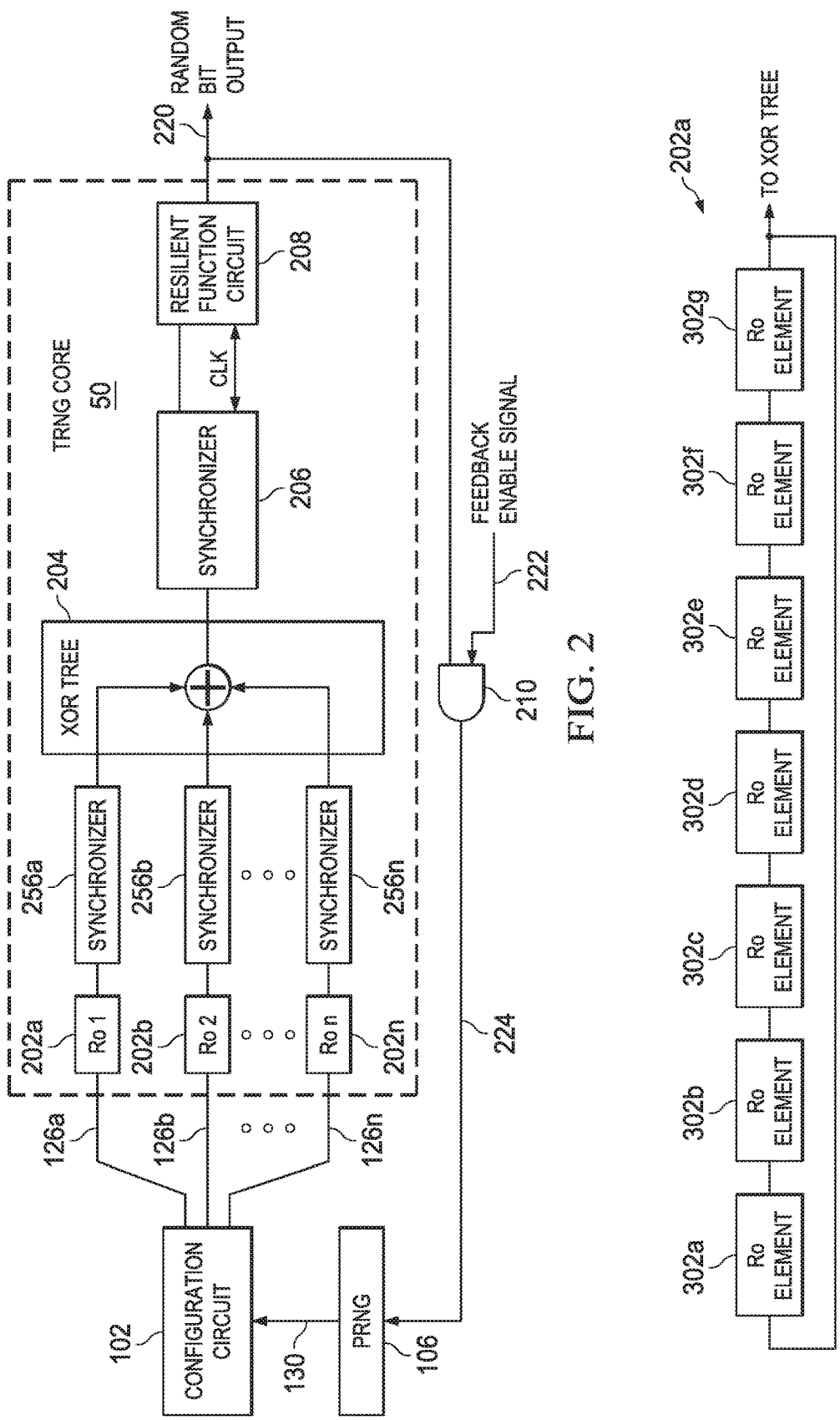

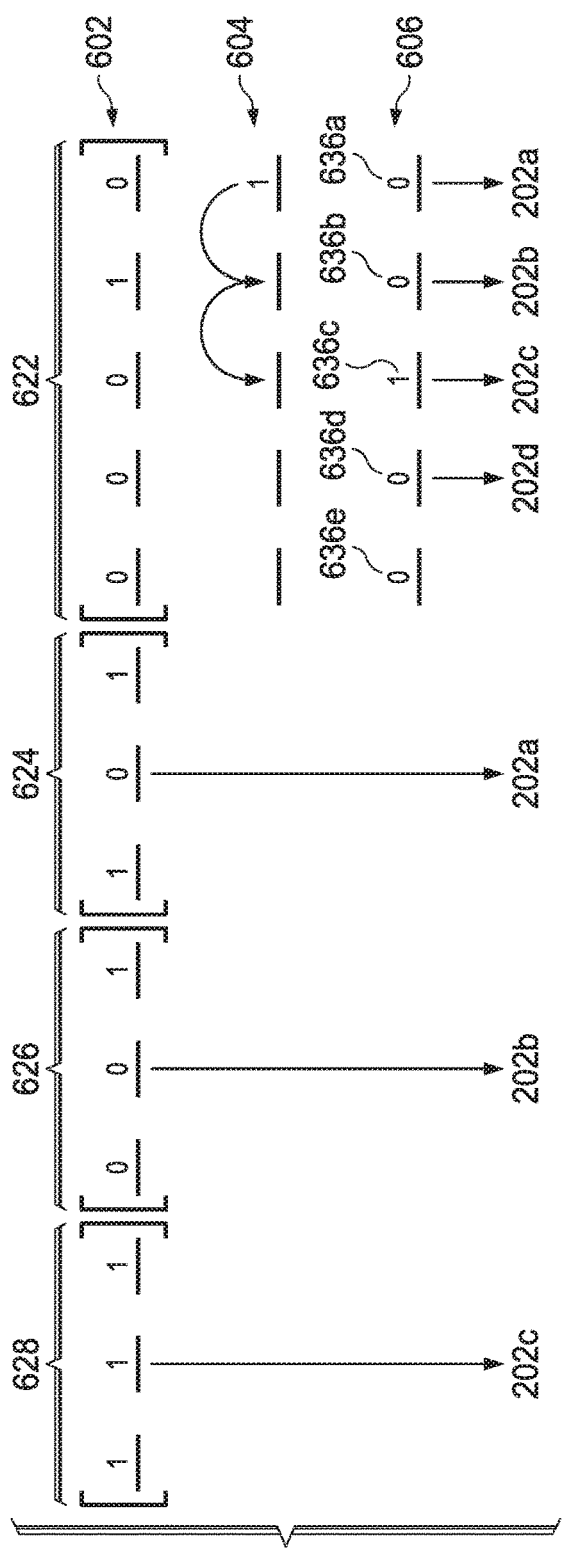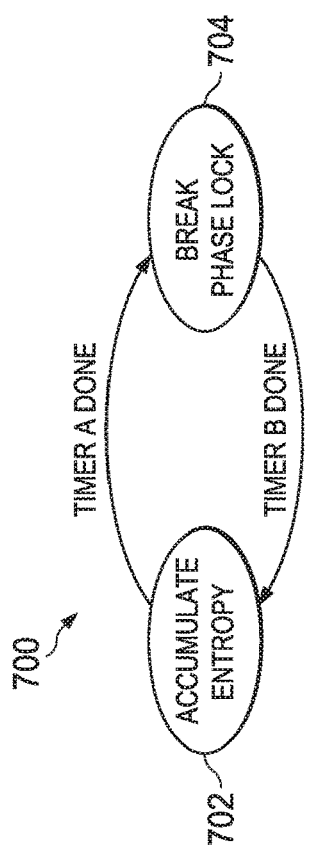
FIG. 6
FIG. 7

PREVENTING RING OSCILLATOR PHASE-LOCK

BACKGROUND

The security of many systems, such as cryptographic systems, relies on unpredictability and irreproducibility of digital key-streams that are used for encryption and/or signing of confidential information. There are at least two fundamentally different strategies for generating random bits. One strategy is to compute numbers deterministically using, for example, a software-implemented algorithm that requires an initial input seed value. This class of random number generators is known as Pseudo/Deterministic Random Number Generators (PRNGs/DRNG). PRNGs must be provided with a random initialization value (seed) to produce an output value that resembles a random bit-stream. PRNGs are periodic, although the periods are typically very long.

Another strategy is to produce bits non-deterministically, where every bit of output is based on a physical process that is unpredictable. Such physical processes may be based, for example, on the production of thermal (resistance or shot) noise. This class of Random Number Generators (RNGs) is commonly known as True Random Number Generators (TRNGs). In hybrid RNG implementations, often a TRNG is used to initialize the PRNG (e.g., provide the seed for the PRNG).

BRIEF DESCRIPTION OF THE DRAWINGS

For a detailed description of various examples, reference will now be made to the accompanying drawings in which:

FIG. 2 shows an illustrative block diagram of a TRNG core and a configuration circuit of a controller configured to control configurations of ring oscillators in the TRNG core based on bits generated by a PRNG in accordance with various embodiments;

FIG. 3 shows an illustrative block diagram of a single ring oscillator containing a single ring oscillator loop of a TRNG core operating in accordance with various embodiments;

FIG. 6 shows an illustrative shift left operation performed by a configuration circuit to generate shutdown bits and configuration bits based on bits generated by a PRNG in accordance with various examples;

FIG. 7 shows an illustrative state diagram of states provided by a finite state machine of a controller configured to break phase lock between ring oscillators in a TRNG core in accordance with various embodiments;

DETAILED DESCRIPTION

Figure 1:
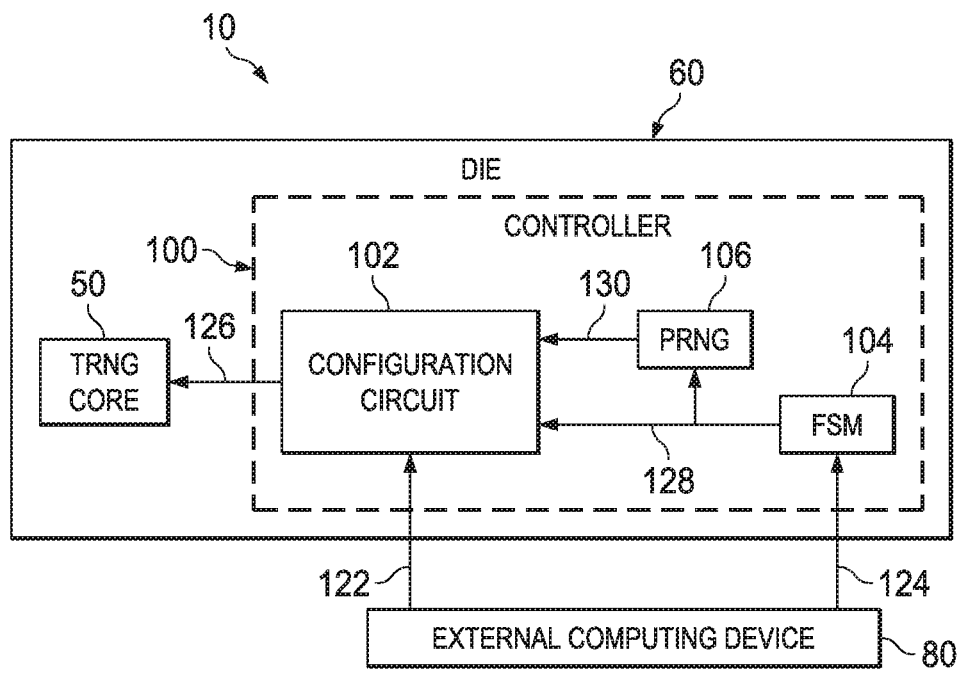
FIG. 1 shows an illustrative block diagram of a system in which a TRNG core is coupled to a controller configured to break a phase lock between ring oscillators in the TRNG core in accordance with various embodiments.

Random number generators (RNGs) produce random binary numbers, which may be statistically independent, uniformly distributed and unpredictable. Random numbers are useful in many applications such as cryptography, communications, probabilistic algorithms, and so on. In particular, many cryptographic applications benefit from relatively high entropy. By way of illustration, if a 128-bit key is generated with only 64-bits of entropy then the encrypted value can be guessed on average in $2^{63}$ attempts. However, if 128 bits of entropy are used, then it will take on average $2^{127}$ attempts to guess correctly the encrypted value. Using 128 bits as opposed to 64 bits is a very significant difference, in many cases making it infeasible to correctly guess the encrypted value. As a consequence, many applications benefit from an embedded, high-quality RNG.

As noted above, often a TRNG is used to initialize a PRNG. Regardless of how or why they are used, TRNGs are based on a physical noise source (e.g., radioactive decay, thermal noise or free running jitter oscillators) and depend strongly on the quality of their implementation. Production of high rate and high quality random bit-streams inside logic-devices is challenging because such devices are usually intended for implementing deterministic data processing algorithms, whereas generating true-randomness generally needs some physical nondeterministic process.

Many conventional TRNGs are implemented utilizing multiple parallel ring oscillators. A ring oscillator includes an odd number (1, 3, 5, etc.) of inverters coupled in a ring configuration. In these implementations, several ring oscillators of the same length (i.e., all of the ring oscillators have the same number of inverters) operate in parallel. The outputs of all of the ring oscillators are combined utilizing an exclusive-OR (XOR) tree and then sampled, sometimes utilizing a synchronizer (e.g., a pair of back-to-back flip-flops). Each inverter causes a deterministic delay in the signal (e.g., 10 ps) and a nondeterministic delay in the signal (e.g., 1 ps). For example, random terminal noise which is introduced into each inverter because electrons within the inverters move in random directions. This causes random small peaks in current of different strengths to flow through each inverter. Hence, truly random variations occur in the delay through each inverter. As the signal traverses through the inverters of each of the parallel ring oscillators, the nondeterministic delay accumulates until the phase in each of the ring oscillators is nondeterministic. Therefore, after waiting for a certain period of time for the random phase to sufficiently accumulate in each of the ring oscillators, the outputs are combined by the XOR tree producing random transitions. The output of the XOR tree is sampled to produce a single random output bit. This process may be repeated to produce a series of randomized bits.

However, the phases generated by conventional multiple parallel ring oscillators tend to interlock (i.e., each of the ring oscillators exhibit similar phases to one another) due to cross capacitance and other similar effects. In other words, the cross capacitance between the different ring oscillators in the TRNG is far stronger than the random effects generated in each inverter. Therefore, the phases of each of the ring oscillators in the TRNG tend to interlock resulting in the outputs of all of the parallel ring oscillators tending to toggle between LOW and HIGH at approximately the same time thereby removing much of the randomness that has accumulated in the phase of the ring oscillator. To prevent cross capacitance, and thus interlock, between the ring oscillators of the TRNG, a physical isolator mechanism could be included between the ring oscillators to prevent any physical effects from creating the interlock. An adequate isolation mechanism may be difficult and expensive to achieve. The disclosed embodiments instead break and/or prevent the dependency between ring oscillators in a TRNG utilizing a deadlock prevention control circuit (FSM) and a set of configurable ring oscillators.

In accordance with the disclosed principles, a TRNG includes a configurable controller which operates to control the configuration of multiple parallel connected ring oscillators based on two states. In the first state, the accumulate entropy state, each of the ring oscillators is configured to a series-connected inverter chain of the same length as the other ring oscillators (i.e., all of the ring oscillators have ring oscillators configured to include the same number of inverters), and each of the ring oscillators is oscillating. Thus, during the accumulate entropy state, each of the ring oscillators has the same configuration as the other ring oscillators in the TRNG. The outputs of all of the ring oscillators are combined utilizing an XOR tree and then sampled, using, for example, a synchronizer (e.g., a pair of flip-flops) to generate a random bit.

However, in the second state, the break phase lock state, one of the ring oscillators, and in some embodiments all of the ring oscillators, are shut down and/or physically reconfigured based on pseudo random bit values generated by a PRNG. In other words, during the break phase lock state, each of the ring oscillators may be configured and/or reconfigured differently from each other based on the values generated by the PRNG. For example, the controller may parse pseudo random bits generated by a PRNG to provide shutdown bits and/or physical configuration bits that are provided to the ring oscillators. If a ring oscillator receives a one as its shutdown bit, that ring oscillator is configured to shut down (i.e., a constant value is forced through that ring oscillator instead of the ring oscillator oscillating) for a cycle. Additionally, the controller may parse the pseudo random bits generated by the PRNG to provide physical configuration bits that cause one or more of the ring oscillators to be configured and/or reconfigured in a different physical configuration than one or more of the other ring oscillators. For example, one ring oscillator may be reconfigured as a single inverter oscillator followed by two 3-inverter oscillators, while another ring oscillator is reconfigured as nine single inverter oscillators. Thus, during the break phase lock state, each ring oscillator may generate signals with different phases and different periods from one another. This breaks any dependency between the ring oscillators so that the phases generated by each of the ring oscillators do not become interlocked.

After a certain amount of time (configurable or fixed), the controller reverts back to the accumulate entropy state, and all of the ring oscillators of the TRNG are again configured to couple together the same number of inverters to form the ring oscillators. In this way, the amount of entropy generated by the TRNG circuit is increased due to reduced interlocking between the different ring oscillators.

FIG. 1 shows an illustrative block diagram of a system 10 in which a TRNG core 50 is coupled to a controller 100 configured to break a phase lock between ring oscillators in the TRNG core 50 in accordance with various embodiments. The TRNG core 50 and the controller 100 may be provided on a die 60. Thus, in this example, the controller 100 is formed on the same die as the TRNG core 50 it is configured to control, although in other examples the controller 100 and the TRNG core 50 it is configured to control may be formed on different dies. Die 60 may be a semiconducting material (e.g., silicon or gallium arsenide GaAs) on which the TRNG core 50 and, in some embodiments, the controller 100 are fabricated. In some embodiments, TRNG core 50 and the controller 100 may be a microprocessor, a system-on-chip (SoC), an application-specific integrated circuit (ASIC), and/or a field-programmable gate array (FPGA).

The TRNG core 50 may be implemented as a circuit which includes any of a variety of different TRNGs, and some of the various TRNGs are described below and shown in various figures. The controller 100 can be customized (i.e., programmed) to configure individual TRNG core configurations or the same controller can be used to configure a variety of different TRNG core configurations. Further, in one example, a system includes multiple (and possibly different) TRNG cores and the controller can selectively configure each core.

The controller 100 of FIG. 1 includes a configuration circuit 102, a finite state machine (FSM) 104, and a PRNG 106. The FSM 104 controls the configuration circuit 102 to operate in two states—the accumulate entropy state and the break phase lock state. The FSM 104 controls the operation of the configuration circuit 102 by providing the timing of when the configuration circuit 102 should assert the different types of control signals 126 to configure and/or reconfigure the ring oscillators of the TRNG core 50 (e.g., each individual ring oscillator within a multi-ring oscillator TRNG core). For example, the FSM 104 may toggle between two states, the accumulate entropy state and the break phase lock state. As the FSM 104 toggles from the break phase lock state to the accumulate entropy state, control signal 128 is generated by the FSM 104 and provided to configuration circuit 102. Configuration circuit 102 then asserts the control signal 126 to the TRNG core 50 causing the ring oscillators in the TRNG core 50 to be configured for the accumulate entropy configuration. Similarly, as the FSM 104 toggles to the break phase lock state from the accumulate entropy state, control signal 128 is generated by the FSM 104 and provided to the configuration circuit 102. Configuration circuit 102 then asserts the control signal 126, in some embodiments as configuration values (i.e., one or more control bits), to the TRNG core 50 causing the ring oscillators in the TRNG core 50 to be configured for the break phase lock configuration. The FSM 104 may continue to cycle between the break phase lock state and the accumulate entropy state.

The PRNG 106 may be any circuit that produces an output value that resembles a random bit-stream. PRNG 106 is periodic, although the periods may be configured to be very long. In an example, PRNG 106 may be a linear-feedback shift register (LFSR). Thus, the PRNG 106 may generate a stream of pseudo random bits 130 that are provided to the configuration circuit 102 in order to generate shutdown bits and/or configuration bits as part of the configuration values 126 during the break phase lock state. While the system 10 is operating in the accumulate entropy state, as determined by the FSM 104, the pseudo random bits 130 may be discarded by configuration circuit 102, or, in some embodiments, in addition to being provided to configuration circuit 102, the control signal 128 generated by the FSM 104, may also be provided to the PRNG 106. Thus, as the FSM 104 toggles to the accumulate entropy state from the break phase lock state, control signal 128 is generated by the FSM 104 and may be provided to the PRNG 106 causing the PRNG

106 to stop generating the pseudo random bits 130. As the FSM 104 toggles to the break phase lock state from the accumulate entropy state, control signal 128 is generated by the FSM 104 and may be provided to the PRNG 106 causing the PRNG 106 to initiate generation of the pseudo random bits 130 which are provided to the configuration circuit 102. The configuration circuit 102 may be configured to parse all or some of the pseudo random bits to generate the configuration values 126 causing the ring oscillators in the TRNG core 50 to reconfigure.

External computing device 80 is, in an embodiment, connected to the controller 100 to enable programming of the configuration circuit 102 and the FSM 104. External computing device 80 may be any computing device that may provide configuration parameters to configuration circuit 102 and FSM 104. In some embodiments, the configuration circuit 102 and the FSM 104 may be programmed during manufacturing of the controller 100. In some embodiments, the configuration circuit 102 and the FSM 104 may be programmed after manufacturing of the controller 100 and/or reprogrammed after the manufacturing of the controller 100.

The external computing device 80 may provide configuration parameters 124 to the FSM 104 which may define the period of time that the FSM 104 is to operate in the accumulate entropy state and the break phase lock state. In some embodiments, the period of time for operations in the accumulate entropy state is longer or shorter than the clock time for the break phase lock state. In other embodiments, the period of time for operations in the accumulate entropy state is equal to the period of time for operations in the break phase lock state. Thus, for example, the external computing device 80 may provide configuration parameters 124 that may instruct the FSM 104 to maintain the accumulate entropy state for 5 seconds and the break phase lock state for 2 seconds. In this example, the external computing device 80 may generate the configuration parameters 124 which are received by the FSM 104. Two timers may then control the toggling of FSM 104. Once the FSM 104 toggles from the break phase lock state to the accumulate entropy state, one timer will time 5 seconds. Once the 5 seconds are complete, the FSM 104 will toggle to the break phase lock state. The second timer will time for 2 seconds. Once the 2 seconds are complete, the FSM 104 will toggle to the accumulate entropy state, and the process then may continue. As discussed above, the external computing device 80 may provide additional configuration parameters 124 that instruct the FSM 104 to change the accumulate entropy period of time and/or the break phase lock period of time.

The external computing device 80 may also provide configuration parameters 122 to the configuration circuit 102 which may define the configurations for the ring oscillators in the TRNG core 50 during the accumulate entropy state and the break phase lock state. For example, the external computing device 80 may provide configuration parameters 122 to the configuration circuit 102 which may instruct the configuration circuit 102 to configure each of the ring oscillators in the TRNG core 50 with a number of series connected inverters of the same length (e.g., all of the ring oscillators have 7 inverters) during the accumulate entropy state. Thus, once the configuration circuit 102 receives signal 128 from FSM 104 indicating that the FSM 104 has toggled to the accumulate entropy state, the configuration circuit 102 will assert the control signal 126 which will cause each of the ring oscillators in the TRNG core 50 to be configured to include, for example, 7 connected inverters in a series ring configuration with every ring oscillator in the TRNG core 50 actively oscillating, thus, accumulating entropy in the system.

The external computing device 80 may also provide configuration parameters 122 to the configuration circuit 102 which may instruct the configuration circuit 102 to parse the generated configuration values 126 by parsing the pseudo random bits 130 received from the PRNG 106 during the break phase lock state. The one or more control bits that comprise the configuration values may control each ring oscillator in the TRNG core 50 separately such that one or more ring oscillators in the TRNG core 50 is shutdown (i.e., instead of oscillating through the inverters of the ring oscillator, a constant value is forced through the ring oscillator) during different cycles of the PRNG. Furthermore, the one or more control bits that comprise the configuration values may cause, in some embodiments, the ring oscillators in the TRNG core 50 to reconfigure in a manner such that one or more of the ring oscillators does not have the same physical configuration (i.e., different ring oscillators may have a different number of ring oscillator element loops as discussed below) as each other during the break phase lock state. Thus, once the configuration circuit 102 receives signal 128 from FSM 104 indicating that the FSM 104 has toggled to the break phase lock state, the configuration circuit 102 will generate the configuration values 126 based on the received pseudo random bits generated by the PRNG 106. This will cause each of the ring oscillators in the TRNG core 50 to reconfigure such that some ring oscillators may be shut down during certain periods of the break phase lock state and some ring oscillators may not have the same physical configuration as other ring oscillators during the break phase lock state.

FIG. 2 shows an illustrative block diagram of TRNG core 50 and configuration circuit 102 of a controller 100 configured to control configurations of ring oscillators in the TRNG core 50 based on bits generated by PRNG 106 in accordance with various embodiments. The TRNG core 50 may include a number of ring oscillators 202*a-n* connected in parallel (the ellipsis between the ring oscillators 202*b* and 202*n* indicates that the TRNG core 50 may support any suitable number of ring oscillators although only three are shown for clarity), synchronizers 256*a-n*, an XOR tree 204, a synchronizer 206, and a resilient function circuit 208. As discussed above, the configuration circuit 102 is configured to generate configuration control signals 126*a-n*, which may take the form as configuration values, that are configured to control the configuration of the ring oscillators 202*a-n*. For example, control signal 126*a* is a control signal that controls the configuration of ring oscillator 202*a*. Similarly, control signal 126*b* controls the configuration of ring oscillator 202*b* while control signal 126*n* controls the configuration of ring oscillator 202*n*.

While operating in the accumulate entropy state, the control signals 126*a-n* are configured to control the configuration of ring oscillators 202*a-n* such that the ring oscillators 202*a-n* are in the same configuration. For example, control signals 126*a-n* may cause each ring oscillator 202*a-n* to be arranged with, for example, 7 inverters connected in series in a single ring oscillator loop during the accumulate entropy state. While operating in the break phase lock state, however, the configuration values act as the control signals 126*a-n* and are configured to control the configuration of ring oscillators 202*a-n* such that one or more of the ring oscillators shuts down during different periods of the break phase lock state and/or to control the configuration of ring oscillators 202*a-n* such that the ring oscillators 202*a-n* have different physical configurations from one ring oscillator to another. For example, during the break phase lock state, ring oscillator 202*a* may have a different physical configuration than ring oscillators 202*b-n*. Similarly, ring oscillator 202*b* may have a different physical configuration than ring oscillators 202*a* and 202*n*.

In some embodiments, synchronizers 256*a-n* are configured to synchronize the ring oscillator 202*a-n* outputs prior to being provided to XOR tree 204. The synchronizers 256*a-n* may include a pair of D flip-flops which capture the value of the ring oscillator 202*a-n* outputs, respectively, at a definite portion of the clock cycle. Thus, the inputs into the XOR tree 204 are a synchronized version of the ring oscillator 202*a-n* outputs. The XOR tree 204 may contain a tree of XOR logic gates that are configured to perform a series of exclusive-or logical operations on the ring oscillator 202*a-n* outputs. For example, one XOR gate in the XOR tree 204 may receive the outputs of ring oscillators 202*a* and 202*b*. The output of this XOR gate is HIGH if the output of ring oscillator 202*a* is different from the ring oscillator 202*b* (i.e., if the output of ring oscillator 202*a* is HIGH and the output of ring oscillator 202*b* is LOW or if the output of ring oscillator 202*a* is LOW and the output of ring oscillator 202*b* is HIGH) and the output is LOW if the output of ring oscillator 202*a* is the same as the output of ring oscillator 202*b* (i.e., if the output of ring oscillator 202*a* is HIGH and the output of ring oscillator 202*b* is HIGH or if the output of ring oscillator 202*a* is LOW and the output of ring oscillator 202*b* is LOW). A second XOR gate in the XOR tree 204 may receive the outputs of other ring oscillators (such as ring oscillator 202*n* and another ring oscillator) and output a signal after performing an XOR operation on those signals. A third XOR gate then may perform an XOR operation of the outputs of the two XOR gates to generate a single XOR tree 204 output signal.

In some embodiments, synchronizer 206 is utilized to sample the output of the XOR tree 204 at various times. In some embodiments, synchronizer 206 is a pair of D flip-flops which captures the value of the XOR tree 204 output at a definite portion of the clock cycle which becomes the output value Q. The resulting bit is random. In some embodiments, the synchronizer 206 is not utilized if synchronizers 256*a-n* are utilized because the bit stream may already be synchronized. Likewise, in embodiments in which synchronizer 206 is utilized, the synchronizers 256*a-n* may not be utilized because the bit stream is synchronized by synchronizer 206. In other words, in some embodiments, either the synchronizers 256*a-n* are utilized to synchronize the bit stream or synchronizer 206 is utilized to synchronize the bit stream, but not both. The resilient function circuit 208 receives the random output bit from the synchronizer 206 (or directly from the XOR tree 204 in embodiments in which synchronizer 206 is not utilized) and is configured to perform a resilient function (e.g., an exposure-resilient function) on the random bits to compress the random output bit-stream 220 and thus enhance the amount of entropy per bit.

In some embodiments, the outputs of the ring oscillators 202*a-n* are sampled during the accumulate entropy state only, while in other embodiments, the outputs of the ring oscillators 202*a-n* are sampled during both the accumulate entropy state and the break phase lock state. Thus, the external computing device 80 may also provide configuration parameters to the controller 100 to configure the TRNG core 50 as to whether to sample ring oscillator 202*a-n* outputs during just the accumulate entropy state or during both the accumulate entropy and break phase lock state.

As discussed above, while operating in the break phase lock state, the PRNG 106 is configured to generate the pseudo random bit stream 130 which is received by the configuration circuit 102. The configuration circuit 102 is configured to parse the pseudo random bits to generate configuration values corresponding to control signals 126*a-n*. For example, the configuration circuit 102 may parse the pseudo random bits 130 to generate one or more control bits that make up a first configuration value 126*a* which is then distributed to ring oscillator 202*a* to control the configuration of ring oscillator 202*a*. Similarly, the configuration circuit 102 may parse the pseudo random bits 130 to generate one or more control bits that make up a second configuration value 126*b* which is then distributed to ring oscillator 202*b* to control the configuration of ring oscillator 202*b*. In some embodiments, at least one of the parsed bits that make up the configuration values 126*a-n* is a shutdown bit. Therefore, if the shutdown bit is a one (or in some embodiments, a zero), then any ring oscillator 202*a-n* that receives a shutdown bit of one, shuts down for a cycle. For example, if ring oscillator 202*a* receives a configuration value that includes a shutdown bit that is one, then ring oscillator 202*a* will configure itself to shut down for one cycle. However, if ring oscillator 202*a* receives a configuration value that includes a shutdown bit that is zero, then ring oscillator 202*a* will maintain oscillation. If the configuration value 126*a* includes additional bits beyond the shutdown bit, those bits may be utilized to physically configure the ring oscillator. For example, if ring oscillator 202*a* receives a configuration value that includes a shutdown bit and additional bits, the additional bits are utilized to configure the physical configuration of ring oscillator 202*a*.

Because the PRNG 106 generates a pseudo random stream of bits that is periodic, in some embodiments, the system 10 may also include a feedback mechanism from the random bit output 220 to the PRNG 106 to introduce additional randomness. Thus, the random bit output 220 generated by the TRNG core 50 may be distributed to an AND gate 210. The AND gate 210 may also receive a feedback enable signal 222. The AND gate 210 then may be configured to perform an AND logical function operation on the random output bit 220 and the feedback enable signal 222. Thus, the feedback enable signal 222 is configured to enable the random bit output 220 to be received by the PRNG 106 when the feedback enable signal 222 is triggered (i.e., toggles from a zero to a one). The feedback enable signal 222 may be configurable and/or programmable by the external computing device 80 and may be generated by a circuit (not shown) in the controller 100. Because the feedback enable signal 222 may be configurable and/or programmable, the feedback enable signal 222 may be configured when to trigger. For example, the feedback enable signal 222 may be configured to trigger after a predetermined number of cycles generated by the PRNG 106 (e.g., after 100 cycles). In another example, the feedback enable signal 222 may be configured to trigger after a predetermined amount of time since a prior feedback enable signal 222 was triggered (e.g., after 0.5 seconds from the immediate previous enable signal 222 being triggered).

The resulting output signal 224 from the AND gate 210 is then combined with any of the pseudo random bits generated by the PRNG 106. For example, if the random bit output 220 is a one, then output signal 224 will be a one when the feedback enable signal 222 is triggered. This output signal 224 then may be combined with any of the bits from the PRNG 106 (e.g., bit 10 of the PRNG). In order to ensure that the bit that the output signal 224 is being combined with in the PRNG 106 (e.g., bit 10) toggles from one to zero or from zero to one, an XOR logical function may be performed on the output signal 224 and the value of the bit that the output signal 224 is being combined (e.g., bit 10). Because the bit that the output signal 224 is being combined toggles from either a one to a zero or from a zero to a one, the PRNG 106 will begin to generate a different pseudo random bit stream 130 than the previous pseudo random bit stream. In this way, additional randomness may be created in the pseudo random bit stream 130 that the configuration circuit 102 utilizes to generate the configuration values 126*a-n* during the break phase lock state.

FIG. 3 shows an illustrative example of a configuration of ring oscillator 202*a* of TRNG core 50 containing a single ring oscillator loop in accordance with various embodiments. In the example shown in FIG. 3, ring oscillator 202*a* includes the ring oscillator elements 302*a-g* connected in series in a single loop. While 7 ring oscillator elements 302*a-g* are shown in FIG. 3, any number of ring oscillator elements may be utilized in the ring oscillators 202*a-n*, although in some embodiments, each of the ring oscillators 202*a-n* have the same number of ring oscillator elements. Ring oscillator elements 302*a-g* may each comprise an inverter. Thus, the output of ring oscillator element 302*a* serves as the input to ring oscillator 302*b* (i.e., the inverter output in ring oscillator element 302*a* serves as the input to the inverter in ring oscillator element 302*b*); the output of ring oscillator element 302*b* serves as the input to ring oscillator element 302*c*; the output of ring oscillator element 302*c* serves as the input to ring oscillator element 302*d*; the output of ring oscillator element 302*d* serves as the input to ring oscillator element 302*e*; the output of ring oscillator element 302*e* serves as the input to ring oscillator element 302*f*; the output of ring oscillator element 302*f* serves as the input to ring oscillator element 302*g*; and the output of ring oscillator element 302*g* serves as the input to ring oscillator element 302*a*.

When operating in the accumulate entropy state, each of the ring oscillators 202*a-n* have the same single loop physical configuration as ring oscillator 202*a* in FIG. 3. Because, during the accumulate entropy state, all of the other ring oscillators 202*b-n* have the same configuration, entropy is accumulated to generate random bits.

Figure 4:
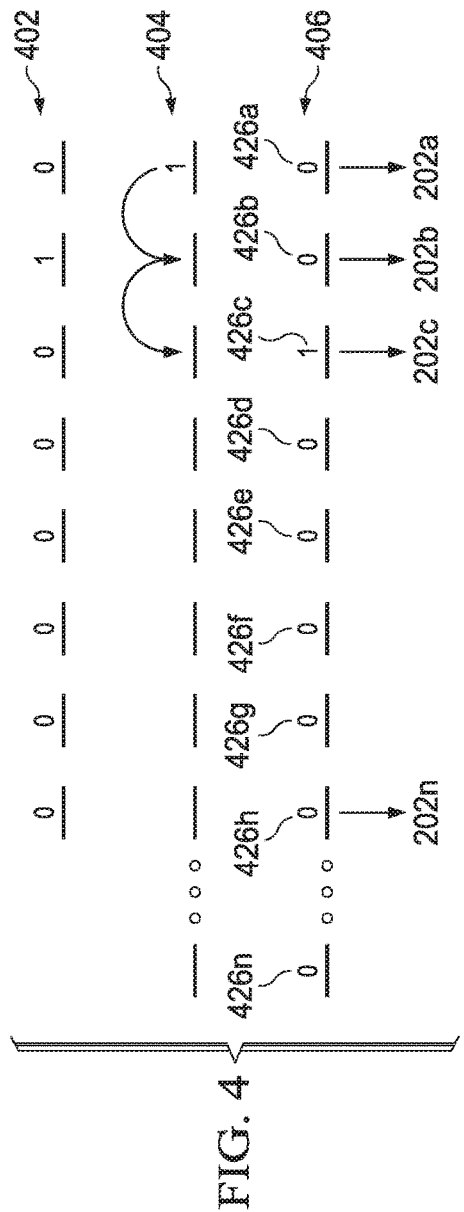
FIG. 4 shows an illustrative shift left operation performed by a configuration circuit to generate shutdown bits based on bits generated by a PRNG in accordance with various examples.

Additionally, in some embodiments, each of the ring oscillators 202*a-n* may also have the same single loop physical configuration as ring oscillator 202*a* in FIG. 3 during the break phase lock state. However, during the break phase lock state, the configuration circuit 102 may generate configuration values utilized to shut down one or more of the ring oscillators 202*a-n*. FIG. 4 shows an illustrative shift left operation performed by configuration circuit 102 to generate shutdown bits for each configuration value 126*a-n* based on bits generated by PRNG 106 in accordance with various examples. More particularly, for ring oscillators 202*a-n* similar to the example ring oscillator 202*a* in FIG. 3 (i.e., ring oscillators that have a single loop configuration), a single shutdown bit may comprise the entirety of each of configuration values 126*a-n*. The example pseudo random stream of bits 402 generated by the PRNG 106 is received by the configuration circuit 102 for parsing. In some embodiments, the configuration circuit 102 may parse any number of pseudo random bits that the configuration circuit 102 receives from the PRNG 106. For example, the configuration circuit 102 may parse the 8 least significant bits from the PRNG 106. In another example, the configuration circuit 102 may parse the 5 least significant bits. In yet another example, the number of bits the configuration circuit 102 parses depends on the number of ring oscillators 202*a-n* in the TRNG core 50. In the stream of bits 402 shown in FIG. 4, 8 pseudo random bits are received by the configuration circuit 102. In this example, the value of the pseudo random bits being parsed is 2 (i.e., the binary 00000010 has a value of decimal 2). Parsing the pseudo random bits 402, may comprise shifting left a binary one a number of bits equal to the value of the pseudo random bits 402 being parsed. For example, as shown in the bit stream 404, a binary one is shifted two bits left because the value of the pseudo random bits is equal to 2.

Once the configuration circuit 102 shifts the binary 1 left, the bits may be arranged as shown in the shutdown bit stream 406. The configuration circuit 102 then may distribute the shutdown bits 426*a*-426*n* to the corresponding ring oscillators 202*a-n*. For example, the shutdown bit 426*a* may be distributed to ring oscillator 202*a* as the configuration value 126*a*; the shutdown bit 426*b* may be distributed to ring oscillator 202*b* as the configuration value 126*b*; the shutdown bit 426*c* may be distributed to ring oscillator 202*c* as the configuration value 126*c*; and the shutdown bit 426*h* may be distributed to the ring oscillator 202*n* as the configuration value 126*n*. A shutdown bit of 1 indicates that the ring oscillator is to shut down for a cycle. Thus, in this example, because shutdown bit 426*c* is a 1, the ring oscillator 202*c* will shut down once it receives the configuration value 126*c*. In this configuration, a single 1 is included as a part of the shutdown bit stream 406. Thus, only one ring oscillator 202*a-n* may shut down during a given cycle. Furthermore, if the number of ring oscillators 202*a-n* is less than the maximum value of the pseudo random bits 402 that are being parsed, then the 1 may occur at a shutdown bit, such as shutdown bit 426*n*, that has no corresponding ring oscillator. For example, if the pseudo random bit stream is binary 10000000, then the 1 will left shift by 128 in the shutdown bit stream 406. If there are less than 128 ring oscillators (e.g., 16 ring oscillators), then no ring oscillator corresponds with the shutdown bit that is 1. Therefore, no ring oscillator will shut down during that cycle. In some embodiments, because shutting down a ring oscillator too often may cause the ring oscillator to lose phase accumulation, it is desirable that the maximum value of the plurality of pseudo random bits 402 is greater than a number of ring oscillators in the TRNG core 50. Thus, a ring oscillator will not shut down at every cycle, but a ring oscillator will shut down during some cycles allowing for any potential phase lock to be broken.

In some embodiments, instead of utilizing shift left parsing described above under FIG. 4, the configuration circuit 102 may take the pseudo random generated bits and distribute them directly as shutdown bits to the ring oscillators 202*a-n* as configuration values 126*a-n*. In this embodiment, more than one ring oscillator may shut down in every cycle.

Figure 5:
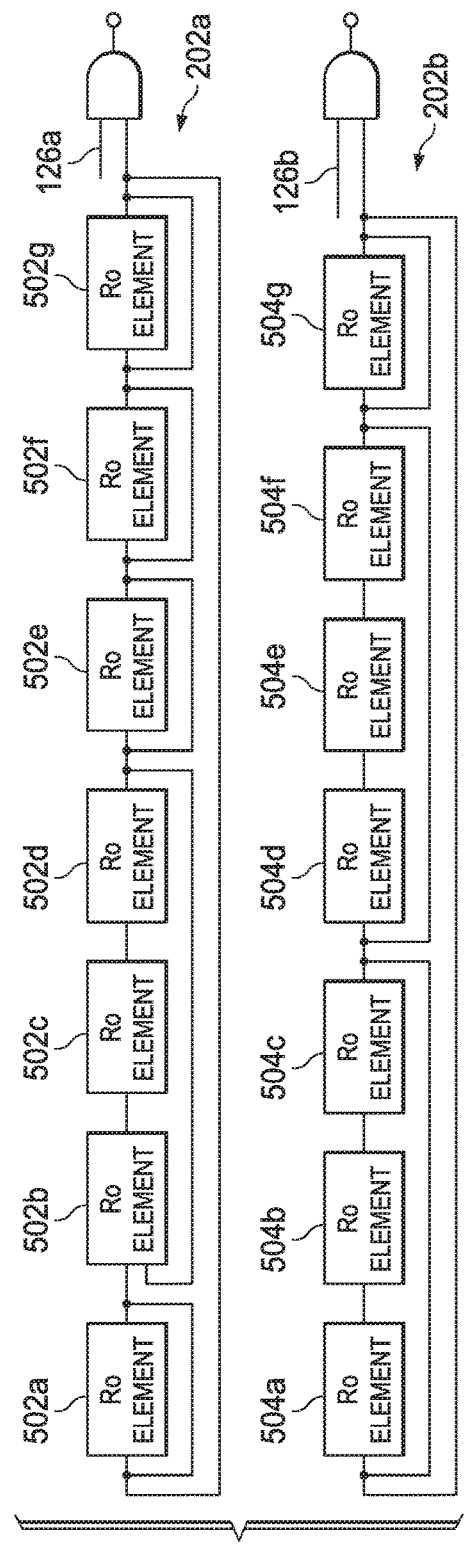
FIG. 5 shows an illustrative block diagram of ring oscillators containing multiple ring oscillator loops of a TRNG core operating in accordance with various embodiments.

When operating in the break phase lock state, in some embodiments, instead of every ring oscillator 202*a-n* having the same single loop physical configuration as ring oscillator 202*a* in FIG. 3, the ring oscillators may receive configuration values 126*a-n* that cause them to reconfigure such that at least one of the ring oscillators 202*a-n* has a different physical configuration than at least one other of the ring oscillators 202*a-n*. FIG. 5 shows an illustrative example of configuration of ring oscillators 202*a* and 202*b* of TRNG core 50 containing multiple ring oscillator loops in accordance with various embodiments. As discussed above, when operating in the break phase lock state, each of the ring oscillators 202*a-n* may have different configurations. The example shown in FIG. 5 is one such possible configuration.

In this example, the ring oscillator 202a includes ring oscillator elements 502a-g connected in multiple different ring oscillator loops. For example, the output of ring oscillator element 502a serves as its input. Thus, the ring oscillator element 502a serves as a ring oscillator loop with a single inverter (a single ring oscillator element loop). Similarly, ring oscillators 502e-f also serve as single ring oscillator element loops (i.e., the output of the ring oscillator element 502e serves as the ring oscillator element 502e input, etc.). However, ring oscillator elements 502b-d form a ring oscillator loop that includes three inverters in series. Thus, the output of ring oscillator element 502b is the input of ring oscillator element 502c; the output of ring oscillator element 502c is the input of ring oscillator element 502d; and the output of ring oscillator element 502d is the input of ring oscillator element 502b. Thus, in this configuration, 5 separate ring oscillator loops are generated in the single ring oscillator 202a. Additionally, because, during the break phase lock state, the configuration circuit 102 may generate configuration values utilized to shut down one or more of the ring oscillators 202a-n in addition to or instead of reconfigure the physical configurations of the ring oscillators 202a-n, in some embodiments, an AND gate may be added to the ring oscillator 202a to perform a AND logical function on the output of RO element 502g and the shutdown bit of configuration value 126a. In this way, a shutdown bit, as part of the configuration values, may be utilized to shut down the ring oscillator 202a.

In this example, the ring oscillator 202b includes ring oscillator elements 504a-g connected in multiple different ring oscillator loops. For example, ring oscillator elements 504a-c form a ring oscillator loop that includes three inverters in series. Thus, the output of ring oscillator element 504a is the input of ring oscillator element 504b; the output of ring oscillator element 504b is the input of ring oscillator element 504c; and the output of ring oscillator element 504c is the input of ring oscillator element 504a. Similarly, ring oscillator elements 504d-f form a ring oscillator loop that includes three inverters in series. Thus, the output of ring oscillator element 504d is the input of ring oscillator element 504e; the output of ring oscillator element 504e is the input of ring oscillator element 504f; and the output of ring oscillator element 504f is the input of ring oscillator element 504d. However, the output of ring oscillator element 504g serves as its input. Therefore, the ring oscillator element 502g serves as a ring oscillator loop with a single inverter (a single ring oscillator element loop). Thus, in this configuration, 3 separate ring oscillator loops are generated in the single ring oscillator 202b. Because the remaining ring oscillators in the TRNG core 50 may be configured differently (i.e., the ring oscillator elements are connected in a different manner), any potential interlock in phase between the ring oscillators 202a-n is prevented or broken when the ring oscillators are configured differently during the break phase lock state. Additionally, because, during the break phase lock state, the configuration circuit 102 may generate configuration values utilized to shut down one or more of the ring oscillators 202a-n in addition to or instead of reconfigure the physical configurations of the ring oscillators 202a-n, in some embodiments, an AND gate may be added to the ring oscillators 202b to perform a AND logical function on the output of RO element 504g and the shutdown bit of configuration value 126b. In this way, a shutdown bit, as part of the configuration values, may be utilized to shut down the ring oscillator 202b.

In the embodiment shown in FIG. 5, during the break phase lock state, the configuration circuit 102 may generate configuration values utilized to shut down one or more of the ring oscillators 202a-n and/or to reconfigure the physical configurations of the ring oscillators 202a-n. FIG. 6 shows an illustrative shift left operation performed by configuration circuit 102 to generate shutdown bits and configuration bits of configuration values 126a-n based on bits generated by PRNG 106 in accordance with various examples. More particularly, for ring oscillators 202a-n, similar to the example ring oscillators 202a and 202b in FIG. 5 (i.e., ring oscillators that have possible multiple loop configurations when in the break phase lock state), a single shutdown bit followed by multiple configuration bits may comprise each of the configuration values 126a-n. The example pseudo random stream of bits 602 generated by the PRNG 106 is received by the configuration circuit 102 for parsing. In some embodiments, the configuration circuit 102 may parse any number of pseudo random bits that the configuration circuit 102 receives from the PRNG 106. For example, the configuration circuit 102 may parse the 17 least significant bits from the PRNG 106. In yet another example, the number of bits the configuration circuit 102 parses depends on the number of ring oscillators 202a-n in the TRNG core 50. In the stream of bits 602 shown in FIG. 6, 14 pseudo random bits are received by the configuration circuit 102. One set of the pseudo random bits 602 may be designated for left shift parsing to determine the shutdown bits and are labelled 622 in FIG. 6. In this example, the value of the pseudo random bits 622 being parsed to is 2 (i.e., the binary 00010 has a value of decimal 2). Parsing the pseudo random bits 622, may comprise shifting left a binary one a number of bits equal to the value of the pseudo random bits 622 being parsed. For example, as shown in the bit stream 604, a binary one is shifted two bits left because the value of the pseudo random bits 622 is equal to 2.

Once the configuration circuit 102 shifts the binary 1 left, the bits may be arranged as shown in the shutdown bit stream 606. The configuration circuit 102 then may distribute the shutdown bits 636a-636e to the corresponding ring oscillators 202a-d (in this example, there are 4 ring oscillators). For example, the shutdown bit 636a may be distributed to ring oscillator 202a as a portion of the configuration value 126a; the shutdown bit 636b may be distributed to ring oscillator 202b as a portion of the configuration value 126b; the shutdown bit 636c may be distributed to ring oscillator 202c as a portion of the configuration value 126c; and the shutdown bit 636d may be distributed to the ring oscillator 202d as a portion of the configuration value 126d. A shutdown bit of 1 indicates that the ring oscillator is to shut down for a cycle. Thus, in this example, because shutdown bit 636c is a 1, the ring oscillator 202c will shut down once it receives the configuration value 126c. In this configuration, a single 1 is included as a part of the shutdown bit stream 606. Thus, only one ring oscillator 202a-n may shut down during a given cycle. Furthermore, if the number of ring oscillators 202a-n is less than the maximum value of the pseudo random bits 622 that are being parsed for the shutdown bits, then the 1 may occur at a shutdown bit, such as shutdown bit 636e, that has no corresponding ring oscillator. For example, if the pseudo bit stream is binary 10000, then the 1 will left shift by 16 in the shutdown bit stream 606. If there are less than 16 ring oscillators (e.g., 4 ring oscillators), then no ring oscillator corresponds with the shutdown bit that is 1. Therefore, no ring oscillator will shut down during that cycle. In some embodiments, because shutting down a ring oscillator too often may cause the ring oscillator to lose phase accumulation, it is desirable that the maximum value of the plurality of pseudo random bits 622 is greater than a number of ring oscillators in the TRNG core 50. Thus, a ring oscillator will not shut down at every cycle, but a ring oscillator will shut down during some cycles allowing for any potential phase lock to be broken.

The additional bits in the pseudo random bit stream 602 may be utilized by the configuration circuit 102 as configuration bits for the ring oscillators 202a-n. For example, configuration bits 624 may be distributed by the configuration circuit 102 to ring oscillator 202a. Thus, the configuration bits 624 in combination with the shutdown bit 636a may comprise the configuration value 126a. The ring oscillator 202a will physically configure according to the configuration bits 624 and will shut down configure according to the shutdown bit 636a (i.e., will shut down or remain oscillating). For example, the ring oscillator 202a may configure itself into multiple loops as shown in the example of FIG. 5 based on the configuration bits 624. Similarly, the configuration bits 626 may be distributed by the configuration circuit 102 to ring oscillator 202b. Thus, the configuration bits 626 in combination with the shutdown bit 636b may comprise the configuration value 126b. The ring oscillator 202b will physically configure according to the configuration bits 626 and will shut down configure according to the shutdown bit 636b. For example, the ring oscillator 202b may configure itself into multiple loops as shown in the example of FIG. 5 based on the configuration bits 626. The configuration bits 628 may be distributed by the configuration circuit 102 to ring oscillator 202c. Thus, the configuration bits 628 in combination with the shutdown bit 636c may comprise the configuration value 126c. The ring oscillator 202c will physically configure according to the configuration bits 628 and will shut down configure according to the shutdown bit 636c. In this way, the configuration circuit 102 may control both the physical configuration and the shutdown configuration during the break phase lock state of embodiments in which a physical configuration including multiple ring oscillator loops is available.

FIG. 7 shows an illustrative state diagram 700 of the states provided by FSM 104 of controller 100 configured to break phase lock between ring oscillators 202a-n in TRNG core 50 in accordance with various embodiments. As discussed above, FSM 104 is configured to toggle between the accumulate entropy state 702 and the break phase lock state 704. Once the accumulate entropy state 702 begins, a timer, labelled as timer A in FIG. 7 begins. Timer A is programmable (e.g., external computing device 80 may program the amount of time for timer A). Once the programmable time elapses from timer A, the FSM 104 toggles from the accumulate entropy state 702 to the break phase lock state 704 and provides control signal 128 to the configuration circuit 102, and in some embodiments, to the PRNG 106. The configuration circuit 102 may then parse the pseudo random bits to generate configuration values 126a-n and distribute the configuration values to the ring oscillators 202a-n in the TRNG core 50. The ring oscillators 202a-n then may configure according to their respective configuration value 126a-n as discussed above.

Once the break phase lock state 704 begins, a timer, labelled as timer B in FIG. 7 begins. Timer B is programmable (e.g., external computing device 80 may program the amount of time for timer B). Once the programmable time elapses from timer B, the FSM 104 toggles from the break phase lock state 704 to the accumulate entropy state 702 and provides control signal 128 to the configuration circuit 102 to configure the ring oscillators 202a-n in the TRNG core 50 in accordance with the configuration parameters 122 for the accumulate entropy state (i.e., ring oscillator elements of the ring oscillators 202a-n are connected to one another in the same configuration and continuously oscillating).

Figure 8:
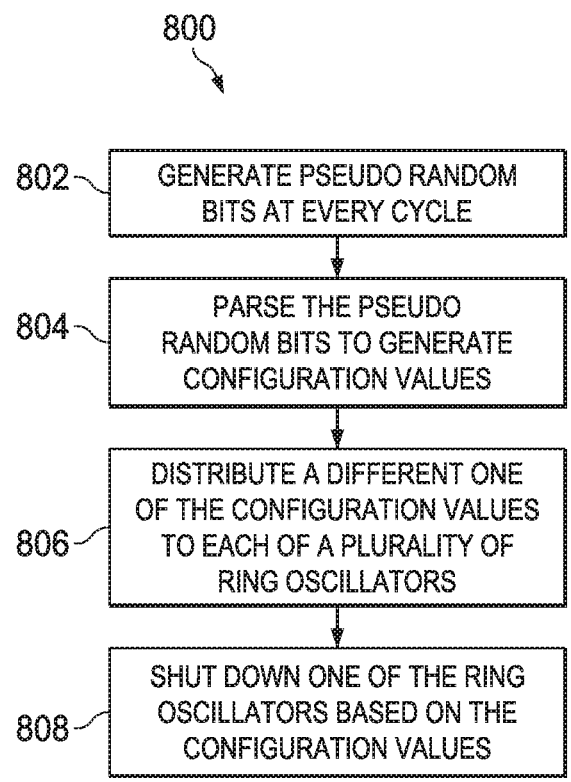
FIG. 8 shows a flow diagram illustrating aspects of operations that may be performed to break a phase lock between ring oscillators in a TRNG core in accordance with various embodiments.

FIG. 8 shows a flow diagram illustrating aspects of operations that may be performed to break a phase lock between ring oscillators in a TRNG core in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 800 may be provided by instructions executed by the controller 100, external computing device 80, and/or TRNG core 50.

The method 800 begins in block 802 with generating pseudo random bits at every cycle. For example, a PRNG, such as PRNG 106, which in some embodiments is a LFSR, may generate a stream of pseudo random bits, such as pseudo random bits 130, that are provided to a configuration circuit, such as configuration circuit 102, in order to generate configuration bits during the break phase lock state. In block 804, the method 800 continues with parsing the pseudo random bits to generate configuration values. For example, the configuration circuit may parse the pseudo random bits into shutdown bits by shifting left a binary one the number of bits equal to the value of the pseudo random bits.

The method 800 continues in block 806 with distributing a different one of the configuration values to each of a plurality of ring oscillators. For example, the configuration circuit may distribute a configuration value, such as the configuration value 126a, to a corresponding ring oscillator, such as ring oscillator 202a. A second configuration value, such as configuration value 126b, may be distributed to a second ring oscillator, such as ring oscillator 202b. In block 808, the method 800 continues with shutting down one of the ring oscillators based on the configuration values. For example, if a shutdown bit of the configuration value 126a is one, then ring oscillator 202a is shut down for a cycle. Shutting down a ring oscillator comprises forcing a constant value through the ring oscillator instead of letting the ring oscillator oscillate.

Figure 9:
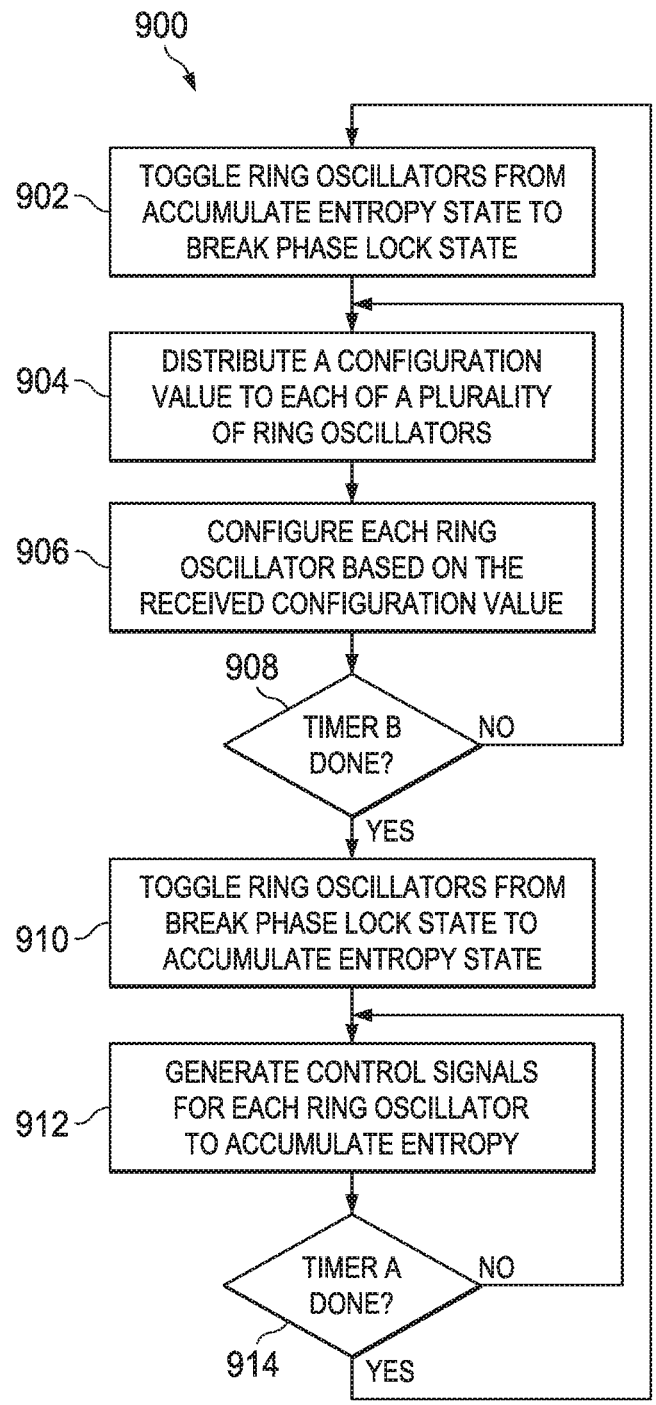
FIG. 9 shows a flow diagram illustrating aspects of operations that may be performed to break a phase lock between ring oscillators in a TRNG core in accordance with various embodiments.

FIG. 9 shows a flow diagram illustrating aspects of operations that may be performed to break a phase lock between ring oscillators in a TRNG core in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 900 may be provided by instructions executed by the controller 100, external computing device 80, and/or TRNG core 50.

The method 900 begins in block 902 with toggling all ring oscillators in a TRNG core, such as ring oscillators 202a-n, from an accumulate entropy state to a break phase lock state. For example, FSM 104 may toggle between two states, the accumulate entropy state and the break phase lock state. As the FSM 104 toggles from the accumulate entropy state to the break phase lock state, a control signal, such as control signal 128 is generated by the FSM 104 and provided to a configuration circuit, such as configuration circuit 102. The configuration circuit then asserts a control signal, such as control signal 126 which may include configuration values, to the TRNG core 50 causing the ring oscillators 202a-n in the TRNG core 50 to toggle from the accumulate entropy state to the break phase lock state.

In block 904, the method 900 continues with distributing the configuration values to each of a plurality of ring oscillators. For example, the configuration circuit may parse pseudo random bits, such as pseudo random bits 130, to generate configuration values. The configuration circuit may distribute each configuration value, such as the configuration value 126a, to a corresponding ring oscillator, such as ring oscillator 202a. A second configuration value, such as configuration value 126b, may be distributed to a second ring oscillator, such as ring oscillator 202b.

The method 900 continues in block 906 with configuring each ring oscillator based on the received configuration value. For example, one of the ring oscillators may be shut down based on the configuration values. If a shutdown bit of the configuration value 126a is one, then ring oscillator 202a is shut down for a cycle. Shutting down a ring oscillator comprises forcing a constant value through the ring oscillator instead of letting the ring oscillator oscillate. Additionally, the configuration values may also include configuration bits that may be utilized to physically configure each of the ring oscillators.

The method 900 continues in block 908 with determining whether a break phase lock timer has elapsed. For example, an external computing device 80 may generate configuration parameters that provide a timer to the FSM 104 for how long the break phase lock state lasts. As soon as the FSM 104 toggles to the break phase lock state, this break phase lock timer begins. If a determination is made in block 908 that the break phase lock timer has not elapsed, the method 900 continues back in block 904 with distributing configuration values to each of the plurality of ring oscillators.

However, if, in block 908, a determination is made that the break phase lock timer has elapsed, the method 900 continues in block 910 with toggling all of the ring oscillators in the TRNG core from the break phase lock state to the accumulate entropy state. For example, as the FSM 104 toggles from the break phase lock state to the accumulate entropy state, a control signal, such as control signal 128 is generated by the FSM 104 and provided to the configuration circuit, such as configuration circuit 102. The configuration circuit then asserts the control signal, such as control signal 126, to the TRNG core 50 causing the ring oscillators 202a-n in the TRNG core 50 to toggle from the break phase lock state to the accumulate entropy state.

In block 912, the method 900 continues with generating control signals for each ring oscillator in the TRNG core 50 to accumulate entropy. For example, once the ring oscillators toggle from the break phase lock state to the accumulate entropy state, the control signals 126 may cause the ring oscillators to configure in a accumulate entropy configuration. In other words, the each of the ring oscillators is configured in a single ring oscillator loop, and none of the ring oscillators is shut down (i.e., all of the ring oscillators are oscillating).

The method 900 continues in block 914 with determining whether an accumulate entropy timer has elapsed. For example, an external computing device 80 may generate configuration parameters that provide a timer to the FSM 104 for how long the accumulate entropy state lasts. As soon as the FSM 104 toggles to the accumulate entropy state, this accumulate entropy timer begins. If a determination is made in block 914 that the accumulate entropy timer has not elapsed, the method 900 continues back in block 912 with generating the control signals for each ring oscillator to accumulate entropy. However, if, in block 914, a determination is made that the accumulate entropy timer has elapsed, the method 900 continues in block 902 with toggling all of the ring oscillators in the TRNG core from the accumulate entropy state to the break phase lock state.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A device, comprising:
   a random number generator (RNG) core that includes a plurality of parallel connected ring oscillators including a first ring oscillator and a second ring oscillator;
   a controller coupled to the RNG core, the controller including:
      a pseudo-random number generator (PRNG) configured to generate a plurality of pseudo random bits at every cycle;
      a configuration circuit configured to parse the pseudo random bits to generate a first configuration value comprised of at least a first bit determined based on the pseudo random bits and a second configuration value comprised of at least a second bit determined based on the pseudo random bits and distribute the first configuration value to the first ring oscillator and the second configuration value to the second ring oscillator; and
      a finite state machine configured to cause the device to operate in an accumulate entropy state for a first period of time and a break phase lock state for a second period of time;
   wherein, when operating in the accumulate entropy state, all of the parallel connected ring oscillators are in a same configuration; and
   wherein, when operating in the break phase lock state, the first ring oscillator is configured according to the first configuration value and the second ring oscillator is configured according to the second configuration value.

2. The device of claim 1, wherein:
   the first bit is configured to shut down the first ring oscillator when the first bit is one; and
   the second bit is configured to shut down the second ring oscillator when the second bit is one.

3. The device of claim 1, wherein the first bit is configured to shut down the first ring oscillator only at a time when the second bit is zero and the second bit is configured to shut down the second ring oscillator only at a time when the first bit is zero.

4. The device of claim 1, further comprising a logical operation tree configured to receive and perform a logical operation on an output of the first ring oscillator and an output of the second ring oscillator to generate a random bit;

wherein the PRNG is further configured to receive the random bit and combine the random bit with a current PRNG state to generate a new PRNG state.

5. A device, comprising:
a plurality of parallel connected ring oscillators including a first ring oscillator and a second ring oscillator;
a pseudo-random number generator (PRNG) configured to generate a plurality of pseudo random bits; and
a configuration circuit configured to generate a first configuration value for the first ring oscillator, including a first bit based on the pseudo random bits, and a second configuration value for the second ring oscillator, including a second bit based on the pseudo random bits;
wherein, the first ring oscillator is configured according to the first configuration value and the second ring oscillator is configured according to the second configuration value.

6. The device of claim 5, wherein the configuration circuit is configured to determine the first bit and the second bit by shifting left a binary one a number of bits equal to a value of the pseudo random bits.

7. The device of claim 6, wherein:
the first bit is configured to shut down the first ring oscillator when the first bit is one; and
the second bit is configured to shut down the second ring oscillator when the second bit is one.

8. The device of claim 7, wherein the first bit is configured to shut down the first ring oscillator only when the second bit is zero and the second bit is configured to shut down the second ring oscillator only when the first bit is zero.

9. The device of claim 5, wherein the first bit is one bit of the pseudo random bits and the second bit is another bit of the pseudo random bits.

10. The device of claim 5, wherein the PRNG is a linear-feedback shift register (LFSR).

11. The device of claim 10, wherein a length of the LFSR is equal to a number of bits in the first configuration value multiplied by a number of ring oscillators in the ring oscillators.

12. The device of claim 5, further comprising a logical operation tree configured to receive and perform a logical operation on an output of the first ring oscillator and an output of the second ring oscillator to generate a random bit;
wherein the PRNG is further configured to receive the random bit and combine the random bit with a current PRNG state to generate a new PRNG state.

13. The device of claim 12, wherein the PRNG is configured to combine the random bit with the current PRNG state by performing an exclusive-or (XOR) operation with the random bit and at least one bit of the current PRNG state.

14. The device of claim 12, wherein the logical operation tree is an XOR tree.

15. The device of claim 5, wherein the device is a microprocessor, a system-on-chip (SoC), an application-specific integrated circuit (ASIC), or a field-programmable gate array (FPGA).

16. A method, comprising:
generating, by a pseudo random number generator (PRNG), a plurality of pseudo random bits;
using the pseudo random bits to generate a plurality of configuration values;
distributing a different one of the configuration values to each of a plurality of parallel connected ring oscillators; and
shutting down one of the parallel connected ring oscillators based on the configuration values.

17. The method of claim 16, wherein using the pseudo random bits to generate the configuration values includes shifting left a binary one a number of bits equal to a value of the pseudo random bits.

18. The method of claim 16, wherein shutting down one of the parallel connected ring oscillators includes forcing a constant value through the one of the parallel connected ring oscillators.

19. The method of claim 16, further comprising:
performing an exclusive-or (XOR) logical operation on outputs of the parallel connected ring oscillators to generate a random bit;
combining the random bit with a current PRNG state in the PRNG to generate a new PRNG state.

20. The method of claim 16, wherein a maximum value of the pseudo random bits is greater than a number of ring oscillators in the ring oscillators.

* * * * *